(12) United States Patent
Jaeger et al.

(10) Patent No.: US 8,212,285 B2
(45) Date of Patent: Jul. 3, 2012

(54) RADIATION DETECTOR

(75) Inventors: Arndt Jaeger, Regensburg (DE); Peter Stauβ, Pettendorf (DE); Reiner Windisch, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 766 days.

(21) Appl. No.: 10/593,792

(22) PCT Filed: Mar. 10, 2005

(86) PCT No.: PCT/DE2005/000428
§ 371 (c)(1),
(2), (4) Date: Sep. 21, 2006

(87) PCT Pub. No.: WO2005/096394
PCT Pub. Date: Oct. 13, 2005

(65) Prior Publication Data
US 2008/0237633 A1 Oct. 2, 2008

(30) Foreign Application Priority Data

Mar. 31, 2004 (DE) .......................... 10 2004 015 931
Jul. 30, 2004 (DE) .......................... 10 2004 037 020
Nov. 4, 2004 (DE) .......................... 10 2004 053 317

(51) Int. Cl.
*H01L 31/102* (2006.01)
(52) U.S. Cl. .................. 257/185; 257/184; 257/E31.005
(58) Field of Classification Search .................. 257/428, 257/440, 77, 2, 184, 185, 188, E31.005
See application file for complete search history.

(56) References Cited

U.S. PATENT DOCUMENTS
3,508,126 A 4/1970 Newman et al.
(Continued)

FOREIGN PATENT DOCUMENTS
DE 626680 2/1936
(Continued)

OTHER PUBLICATIONS

Karrer, U. et al., "AlGaN-based Ultraviolet Light Detectors with Integrated Optical Filters", *Journal of Vacuum Science & Technology B*, vol. 18, No. 2, pp. 757-760, 2000.

(Continued)

*Primary Examiner* — Zandra Smith
*Assistant Examiner* — Paul Patton
(74) *Attorney, Agent, or Firm* — Fish & Richardson P.C.

(57) ABSTRACT

The invention specifies a radiation detector for detecting radiation (8) according to a predefined spectral sensitivity distribution (9) that exhibits a maximum at a predefined wavelength $\lambda_0$, comprising a semiconductor body (1) with an active region (5) serving to generate a detector signal and intended to receive radiation, in which according to one embodiment the active region (5) includes a plurality of functional layers (4a, 4b, 4c, 4d) that have different band gaps and/or thicknesses and are implemented such that they (4a, 4b, 4c, 4d) at least partially absorb radiation in a range of wavelengths greater than $\lambda_0$. According to a further embodiment, disposed after the active region is a filter layer structure (70) comprising at least one filter layer (7, 7a, 7b, 7c), said filter layer structure determining the short-wave side (101) of the detector sensitivity (10) according to the predefined spectral sensitivity distribution (9) by absorbing wavelengths smaller than $\lambda_0$. A radiation detector for detecting radiation (8) according to the spectral sensitivity distribution (9) of the human eye is also specified. The semiconductor body can be monolithically integrated.

39 Claims, 4 Drawing Sheets

U.S. PATENT DOCUMENTS

| | | | |
|---|---|---|---|
| 3,903,413 A | 9/1975 | Manning | |
| 4,360,246 A * | 11/1982 | Figueroa et al. | 385/14 |
| 4,451,691 A | 5/1984 | Fraas | |
| 4,713,493 A * | 12/1987 | Ovshinsky | 136/249 |
| 4,820,915 A * | 4/1989 | Hamakawa et al. | 257/53 |
| 5,039,490 A | 8/1991 | Marsoner et al. | |
| 5,373,182 A | 12/1994 | Norton | |
| 5,406,067 A * | 4/1995 | Keller | 250/208.1 |
| 5,448,082 A | 9/1995 | Kim | |
| 5,449,923 A * | 9/1995 | Kuo et al. | 257/53 |
| 5,583,351 A | 12/1996 | Brown et al. | |
| 5,600,157 A | 2/1997 | Abiko et al. | |
| 5,689,123 A * | 11/1997 | Major et al. | 257/190 |
| 5,703,689 A | 12/1997 | Powell | |
| 5,813,753 A | 9/1998 | Vriens et al. | |
| 6,038,023 A | 3/2000 | Carlson et al. | |
| 6,449,437 B1 | 9/2002 | Ogawa | |
| 6,476,374 B1 * | 11/2002 | Kozlowski et al. | 250/214.1 |
| 7,521,737 B2 * | 4/2009 | Augusto | 257/233 |
| 2002/0074553 A1 | 6/2002 | Starikov et al. | |
| 2002/0101895 A1 * | 8/2002 | Augusto | 372/44 |
| 2003/0001167 A1 * | 1/2003 | Eriksson et al. | 257/98 |
| 2003/0122060 A1 | 7/2003 | Nixon et al. | |
| 2003/0222264 A1 | 12/2003 | Matsuo et al. | |
| 2005/0072908 A1 | 4/2005 | Grunert et al. | |
| 2007/0040101 A1 | 2/2007 | Haas et al. | |
| 2008/0237633 A1 | 10/2008 | Jaeger et al. | |

FOREIGN PATENT DOCUMENTS

| | | |
|---|---|---|
| DE | 2315054 | 10/1974 |
| DE | 2457572 | 6/1975 |
| DE | 2457572 | 9/1989 |
| DE | 19621965 | 12/1997 |
| DE | 10154277 | 1/2003 |
| EP | 0 509215 | 10/1992 |
| GB | 2 107112 | 4/1983 |
| JP | 50-091339 | 7/1975 |
| JP | 62-26868 | 2/1987 |
| JP | 63-94125 | 4/1988 |
| JP | 3-289523 | 12/1991 |
| JP | 05-235410 | 9/1993 |
| JP | 2000-252482 | 9/2000 |
| JP | 2001-119063 | 4/2001 |
| JP | 2001308351 | 11/2001 |
| JP | 2002-83996 | 3/2002 |
| JP | 2003150089 | 5/2003 |
| JP | 2003-258292 | 9/2003 |
| TW | 473893 | 1/2002 |
| WO | WO 98/22982 | 5/1998 |
| WO | WO 2005/041247 | 5/2005 |
| WO | WO 2005/096394 | 10/2005 |

OTHER PUBLICATIONS

Authorized officer: Werner, A.., *International Search Report*, PCT/DE2005/000428, 2005.

English translation of examination report for Japanese Application No. 2006-529611, dated Nov. 26, 2010.

Office Action for Japanese Patent Application No. 2007-505365, dated Feb. 10, 2011.

Communication from the European Patent Office with regard to application No. 04786174.5—1528 / 1668674 dated May 2, 2012.

"InGaAlP-High Brightness Light Emitting Diode (630 nm, High Optical Power)" URL: http://www.datasheetarchive.com/osram+topled-datasheet.html dated Apr. 8,2003.

* cited by examiner

- ◆ S(λ) human eye (V(λ)-CIE)
- ▫ S(λ) detector

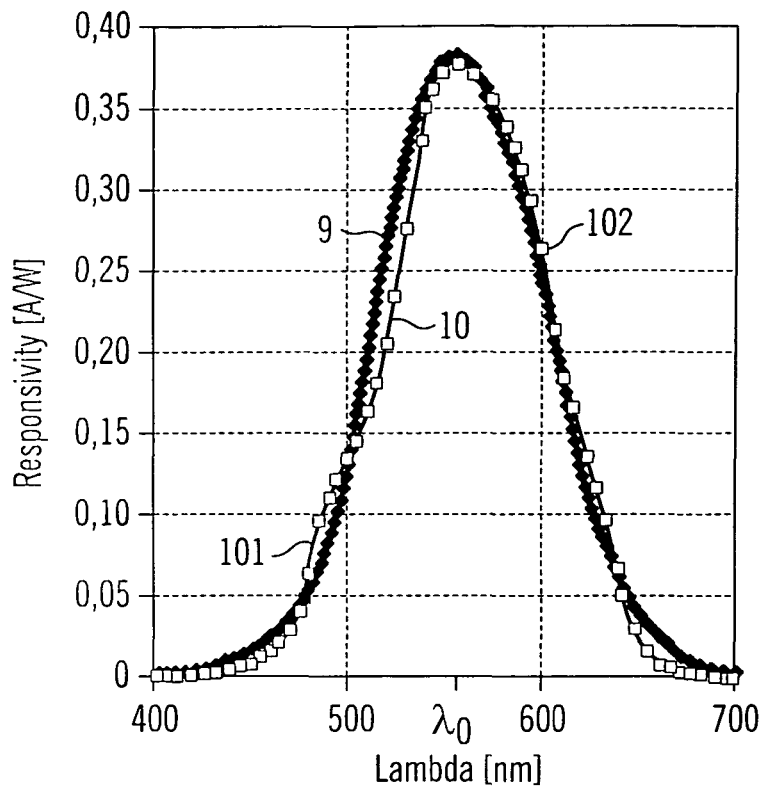
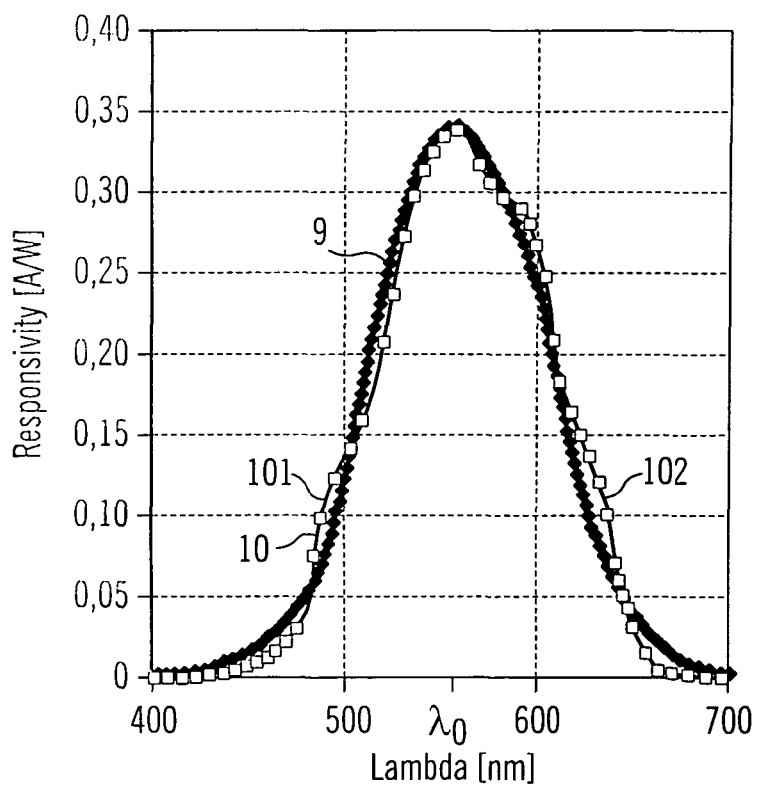

RADIATION DETECTOR

CROSS-REFERENCE TO RELATED APPLICATIONS

This application is the National Stage of International Application No. PCT/DE2005/000428, filed on Mar. 10, 2005, which claims the priority to German Patent Applications Serial No. 10 2004015931.9, filed on Mar. 31, 2004, Serial No. 2004 037020.6, filed on Jul. 30, 2004 and Serial No. 2004 053317.2, filed on Nov. 4, 2004. The contents of priority applications are hereby incorporated by reference in their entireties.

FIELD OF THE INVENTION

The present invention concerns a radiation detector for detecting radiation in accordance with a predefined spectral sensitivity distribution that exhibits a maximum at a predefined wavelength $\lambda_0$, comprising a semiconductor body with an active region serving to generate a detector signal and intended to receive radiation. The invention particularly concerns a radiation detector for detecting radiation according to the predefined spectral sensitivity distribution of the human eye.

BACKGROUND OF THE INVENTION

Radiation detectors provided with a specially adapted external filter system, such as for example interference filters or monochromators, are often used to detect radiation with a predefined spectral sensitivity distribution that has a maximum at a predefined wavelength $\lambda_0$. Such detectors are distinguished by very good matching of the predefined spectral sensitivity distribution, but are usually comparatively labor- and cost-intensive to handle and produce. Furthermore, they often have high spatial requirements, precluding or limiting their ability to be used in small spaces.

If the predefined spectral sensitivity distribution is that of the human eye, then a silicon photodiode is often used to detect incident radiation according to that sensitivity.

The sensitivity of a photodiode depends on—among other things—the wavelengths of the incident radiation. At wavelengths in excess of a boundary wavelength corresponding to the band gap, the sensitivity is very low, since for incident radiation in this wavelength range the band gap of the functional material in the active region of the diode—for example Si—is greater than the energy of the incident radiation and is therefore insufficient to generate electron-hole pairs. By the same token, sensitivity declines in the range of diminishing wavelength, since as the wavelength decreases, the electron-hole pairs that are produced, for example by surface recombination, progressively cease to contribute to the photocurrent. In the intermediate range, the sensitivity of the diode has a maximum which in a conventional silicon photodiode can occur at above 800 nm.

The use of such a silicon photodiode as a detector having the spectral sensitivity distribution of the bright-adapted human eye, which shows a maximum sensitivity at about 555 nm, requires additional expenditure, since the wavelengths of the sensitivity maxima sharply differ from each other and the two spectral sensitivity distributions therefore match relatively poorly. The matching of detector sensitivity to the sensitivity distribution of the human eye can be improved through the use of additional filters. The additive result is a sensitivity distribution close to that of the human eye.

SUMMARY OF THE INVENTION

It is an object of the invention to specify a radiation detector of the aforesaid kind which can be produced in simplified fashion. A further object of the invention is to specify a radiation detector of the aforesaid kind having reduced spatial requirements.

An inventive radiation detector for detecting radiation in accordance with a predefined spectral sensitivity distribution that exhibits a maximum at a predefined wavelength $\lambda_0$ comprises, in a first embodiment, a semiconductor body with an active region serving to generate a detector signal and intended to receive radiation, wherein the active region includes a plurality of functional layers and said functional layers have different band gaps and/or thicknesses and are implemented such that they at least partially absorb radiation in a wavelength range that includes wavelengths greater than the wavelength $\lambda_0$.

In a preferred implementation, the predefined spectral sensitivity distribution is that of the human eye.

In a further preferred implementation of the invention, the semiconductor body, particularly the active region or the functional layers, contains at least one III/V semiconductor material, for example from one of the material systems $In_xGa_yAl_{1-x-y}P$, $In_xGa_yAl_{1-x-y}N$ or $In_xGa_yAl_{1-x-y}As$, where in each case $0 \leq x \leq 1$, $0 \leq y \leq 1$ and $x+y \leq 1$. Furthermore, the semiconductor body, particularly the active region or the functional layers, can contain a material from the material system $In_yGa_{1-y}As_xP_{1-x}$, with $0 \leq x \leq 1$ and $0 \leq y \leq 1$.

It is expedient to use a III/V semiconductor material that can have band gaps in the region of the wavelength $\lambda_0$ or the region of the predefined spectral sensitivity distribution.

The aforesaid III/V semiconductor materials are especially suitable in particular for radiations in the ultraviolet (e.g. $In_xGa_yAl_{1-x-y}N$) through the visible ($In_xGa_yAl_{1-x-y}N$, $In_xGa_yAl_{1-x-y}As$, $In_xGa_yAl_{1-x-y}P$) to the infrared (e.g. $In_xGa_yAl_{1-x-y}P$ or $In_xGa_yAl_{1-x-y}As$) regions of the spectrum. If the predefined spectral sensitivity distribution is that of the human eye, then $In_xGa_yAl_{1-x-y}As$ or $In_xGa_yAl_{1-x-y}P$ is particularly suitable as the material system. Especially high quantum efficiencies can be obtained with the material system $In_xGa_yAl_{1-x-y}P$.

In a further preferred implementation of the invention, the semiconductor body, particularly the active region or the functional layers, contains at least one II/VI semiconductor material, such as a semiconductor material from the material system $Zn_yMg_{1-y}S_xSe_{1-x}$, in which $0 \leq x \leq 1$ and $0 \leq y \leq 1$. II/VI semiconductor materials may also be suitable for the above-cited regions of the spectrum. However, III/V semiconductor materials are often superior to II/I semiconductor materials owing to the greater ease with which they can be made to achieve high quantum efficiencies.

In a second embodiment, an inventive radiation detector for detecting radiation in accordance with the predefined spectral sensitivity distribution of the human eye, which exhibits a maximum at the wavelength $\lambda_0$, comprises a semiconductor body with an active region serving to generate a detector signal and intended to receive radiation, wherein the semiconductor body contains at least one III/V semiconductor material and the active region includes a plurality of semiconductor layers.

The functional layers are preferably implemented at least in part such that they absorb radiation in a wavelength range that includes wavelengths greater than the wavelength $\lambda_0$ and/or so that at least some of them have different band gaps and/or thicknesses.

Radiation incident on the radiation detectors described in the above embodiments can be absorbed by the functional layers, in which case the thickness of the respective functional layer determines the fraction of the radiant power absorbed by it and the band gap determines the wavelength of the absorbed radiation. Via the implementation of the functional layers, the active region can be implemented such that the signal (e.g. the photocurrent or values depending thereon) generated by the radiation detector behaves according to the predefined spectral sensitivity distribution. This preferably applies in particular to the long-wave side of the predefined spectral sensitivity distribution, where the wavelengths are greater than $\lambda_0$.

Advantageously, there is no longer any need for external filters—filters disposed outside the semiconductor body—to match the sensitivity of the detector to the predefined spectral sensitivity distribution, particularly its long-wave side. Complex filtering using external filters is an especially common expedient in connection with conventional Si photodiodes. The elimination of external filters makes it possible to configure the radiation detector in a space-saving manner.

Furthermore, the strength of the detector signal of such a radiation detector can advantageously be increased in comparison to radiation detectors equipped with external optical filters, since due to the absence of external optical filters, long-wave radiation can also be used to a greater extent to generate signals.

According to an advantageous implementation of the above two embodiments, disposed after the active region is a filter layer structure that includes at least one filter layer. The filter layer structure preferably determines the short-wave side of the detector sensitivity in accordance with the predefined spectral sensitivity distribution by absorbing radiation in a wavelength range that includes wavelengths smaller than $\lambda_0$.

By means of the filter layer structure, the sensitivity of the radiation detector can be matched to the predefined spectral sensitivity distribution, particularly on the short-wave side for wavelengths smaller than $\lambda_0$.

An inventive radiation detector for detecting radiation in accordance with a predefined spectral sensitivity distribution that exhibits a maximum at a predefined wavelength $\lambda_0$ comprises, according to a further embodiment, a semiconductor body with an active region serving to generate a detector signal and intended to receive radiation, in which disposed after the active region is a filter layer structure comprising at least one filter layer, and the filter layer structure determines the short-wave side of the detector sensitivity in accordance with the predefined spectral sensitivity distribution by absorbing wavelengths in a wavelength range that includes wavelengths smaller than $\lambda_0$.

In a preferred implementation, the predefined spectral sensitivity distribution is that of the human eye.

In a further preferred implementation, the semiconductor body contains at least one III/V or II/VI semiconductor material.

In a further preferred implementation, the active region comprises a plurality of functional layers, said functional layers at least partially absorb radiation in a wavelength range that includes wavelengths greater than the wavelength $\lambda_0$, and/or the functional layers have different band gaps and/or thicknesses.

The filter layer structure therefore determines the short-wave side of the detector sensitivity and, optionally in combination with appropriate functional layers, simplifies the implementation of a small and compact radiation detector having a detector sensitivity that accords with the predefined spectral sensitivity distribution.

In a further preferred implementation of the invention, two arbitrary functional layers have different band gaps and/or different thicknesses.

In further preferred implementation of the invention, the functional layers determine by their implementation the detector sensitivity in accordance with the predefined spectral sensitivity distribution for wavelengths greater than $\lambda_0$.

In a still further preferred implementation of the invention, the wavelength range in which the functional layers absorb is substantially contiguous and/or substantially includes wavelengths greater than $\lambda_0$.

Preferably, differently implemented functional layers are provided in the active region for different wavelength ranges of the predefined sensitivity distribution. Particularly preferably, the functional layers—all or at least one of them—have a band gap that corresponds to a wavelength greater than $\lambda_0$.

For wavelength ranges in which the predefined sensitivity distribution assumes relatively high values, the functional layers are preferably implemented as correspondingly thick, so that a correspondingly high radiant power is absorbed in that wavelength range and a relatively high photocurrent is therefore generated. For wavelength ranges at which the predefined sensitivity distribution has lower values, the functional layers are preferably implemented as correspondingly thin. The thickness of the respective functional layer can be used to purposefully influence the responsivity of the radiation detector (the ratio of the generated signal strength to the radiant power incident on the detector) in the wavelength range corresponding to the respective functional layer, and the ratios of the thicknesses of the functional layers to each other can be used to match the detector sensitivity to the predefined spectral sensitivity distribution, particularly to the long-wave side for wavelengths greater than $\lambda_0$. Particularly preferably, at least one functional layer has a band gap in the range around the wavelength $\lambda_0$ so that a comparatively high signal is produced in that range.

According to a preferred implementation of the invention, the band gap of functional layers disposed in the semiconductor body increases or decreases at least partially in the direction of the incident radiation, particularly in the direction of the radiation input side, where the radiation to be received passes into the semiconductor body. This advantageously makes it easier to devise a radiation detector with a detector sensitivity that accords with the predefined sensitivity, since the production of the semiconductor body with band gaps for the functional layers that increase or decrease in the direction of the radiation input side is advantageously simplified in comparison to arbitrary arrangement of the functional layers.

In a further preferred implementation of the invention, the band gaps of at least some of the functional layers disposed in the semiconductor body increase in the direction of the incident radiation.

In an advantageous improvement of the invention, the functional layers are arranged such that the band gaps of the functional layers increase progressively from a central region of the active region in a direction vertical to the radiation input side of the semiconductor body and in the opposite direction. The band gaps of the functional layers preferably increase progressively from the central region in graded fashion, resulting in a band gap profile that decreases gradedly from the central region in the direction of the incident radiation and in the direction opposite thereto. Electron-hole pairs generated in the central region can therefore leave the central region relatively unhindered, thus advantageously increasing the efficiency of the radiation detector.

For purposes of signal generation, the functional layers are preferably disposed in a space charge region of the semiconductor body. This space charge region can be formed by means of and/or between a p-conducting, preferably highly doped, layer and an n-conducting, preferably highly doped layer.

Particularly preferably, according to the invention substantially only the electron-hole pairs generated in the space charge region of the semiconductor body contribute to the detector signal.

Furthermore, the functional layers are preferably implemented at least in parts as substantially undoped or intrinsic. The semiconductor body can therefore be substantially equivalent to a PIN diode structure. Structures of this kind are distinguished by advantageously low response times.

The active region is preferably implemented in the manner of a heterostructure, such as a single or multiple heterostructure. Heterostructures may be distinguished by an advantageously high internal quantum efficiency.

In a further advantageous implementation of the invention, the detector sensitivity and/or the predefined spectral sensitivity distribution is different from zero in a contiguous wavelength range.

In a further advantageous implementation of the invention, the filter layer structure is disposed after the active region on the radiation input side, particularly on the side nearer the radiation input side. In particular, the filter structure is preferably disposed after the active region such that the radiation to be received by the radiation detector passes in part through the filter layer structure and, after doing so, impinges on the active region to generate a signal. The filter layer structure can be disposed between a radiation input surface of the radiation detector and the active region or the semiconductor body.

The filter layer structure is preferably part of the semiconductor body and is integrated monolithically thereinto. The radiation fraction absorbed in the filter layer structure does not strike the active region, and thus only a proportionately diminished signal is generated within the range of wavelengths in which the filter layer structure absorbs. The filter layer structure is preferably disposed between the radiation input side of the semiconductor body and the active region.

The filter layer structure preferably contains a III/V or II/VI semiconductor material, for example selected from one of the above-cited material systems.

In a preferred implementation of the invention, the wavelength range in which the filter layer structure absorbs is substantially contiguous and/or includes substantially wavelengths smaller than $\lambda_0$. Particularly preferably, the band gap of a filter layer of the filter layer structure is greater than that of a functional layer disposed after the filter layer structure on the side nearer the semiconductor body.

In a first advantageous improvement of the invention, the filter layer structure comprises substantially a single filter layer having a direct band gap and/or an indirect band gap. The direct band gap is preferably greater than the band gap of a, particularly arbitrary, functional layer disposed after the filter layer on the side nearer the active region.

In addition, the filter layer preferably determines the short-wave side of the detector sensitivity by absorbing radiation via the indirect band gap in a wavelength range that includes wavelengths smaller than $\lambda_0$. The thickness of the filter layer can be used to determine the fraction of radiation absorbed in the filter layer via the indirect band gap. The thickness of the filter layer is expediently more than 1 μm, particularly 10 μm or more, for this purpose.

The direct band gap of the filter layer preferably determines the short-wave limit of detector sensitivity. Radiation incident on the radiation detector and having wavelengths smaller than the short-wave boundary wavelength is absorbed substantially completely in the filter layer, and substantially no detector signal is generated in the wavelength range smaller than the boundary wavelength.

GaP- or AlGaAs-containing semiconductor materials are particularly suitable for a filter layer in a detector based on the sensitivity of the eye, since they can have both a direct and an indirect band gap that correspond to wavelength ranges suitable for the sensitivity of the eye.

In a second advantageous improvement, the filter layer structure comprises a plurality of filter layers, preferably of different band gaps and/or thicknesses. In particular, two arbitrary filter layers of a given filter layer structure can have different band gaps and/or thicknesses. Particularly preferably, the filter layer structure determines the short-wave side of the detector sensitivity by absorbing radiation via a direct band gap of the respective filter layer in a wavelength range that includes wavelengths smaller than $\lambda_0$. Particularly preferably, the band gap, particularly the direct band gap, of a, preferably arbitrary, filter layer of the filter layer structure is greater than that of a, preferably arbitrary, functional layer disposed after the filter layer structure on the side nearer the semiconductor body.

Using a plurality of filter layers each of which absorbs via its direct band gap enables the overall thickness of the filter layer structure to be kept advantageously small in comparison to a single filter layer that determines the short-wave side of detector sensitivity via the indirect band gap.

A filter layer structure with a plurality of filter layers and a thickness of 1 μm or less already yields a very good match of detector sensitivity to the predefined spectral sensitivity distribution.

Furthermore, the relatively low layer thicknesses of the filter layers makes it possible to avoid an abrupt drop in detector sensitivity at wavelengths smaller than a short-wave boundary wavelength. A significant signal can still be generated even at wavelengths smaller than the largest direct band gap of the filter layers of the filter layer structure.

According to a further preferred implementation, the semiconductor body with the functional layers is produced as monolithically integrated, for example by epitaxial growth on a growth substrate. This simplifies the production of an inventive radiation detector.

In an advantageous improvement, the semiconductor body with the active region, the functional layers and the filter layer structure is produced as monolithically integrated. Such a monolithically integrated semiconductor chip can accordingly be implemented such that the sensitivity of the semiconductor chip is shaped according to the predefined sensitivity distribution. With such a monolithically integrated semiconductor body it is advantageously possible to eliminate from the radiation detector any externally disposed filters, such as interference filters or monochromators, thus making it easier to configure a radiation detector with low spatial requirements.

The invention can be used in particular as an ambient light sensor corresponding to the predefined spectral sensitivity distribution.

Further uses of the radiation detector can include controlling the brightness levels of lighting devices or indicators and the turn-on and/or turn-off instants of lighting devices. Such lighting devices can be implemented as indoor and outdoor area lights for residences, streets or cars, as well as backlighting devices for displays such as cell phone displays, automotive displays and dashboard panels, or LCD screens. It is of particular interest in the latter applications that the radiation detector have very small spatial requirements.

In the cited uses of the invention, the predefined sensitivity is preferably that of the human eye. In this way, for example the brightness levels of the aforesaid lighting devices can advantageously be controlled—by increasing or decreasing the brightness—based on how they are perceived by the human eye.

Further features, advantages and utilities of the invention will emerge from the description of the following exemplary embodiments in conjunction with the figures.

BRIEF DESCRIPTION OF THE DRAWINGS

Elements of the same kind and identically acting elements are provided with the same reference numerals in the figures.

DETAILED DESCRIPTION OF THE PREFERRED EMBODIMENTS

Figure 1:
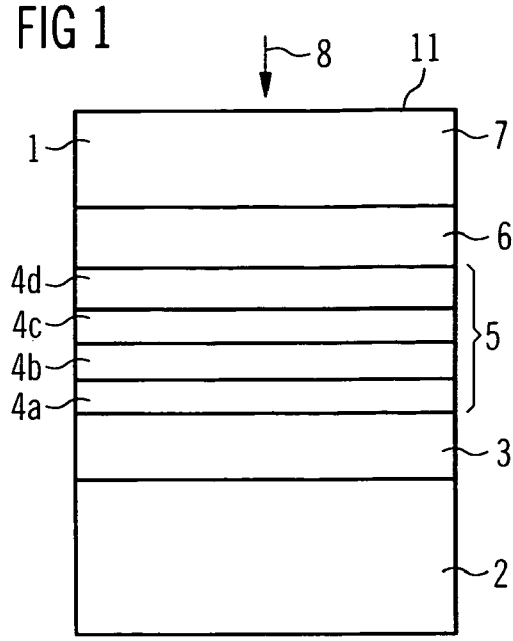
FIG. 1 shows a first exemplary embodiment of an inventive radiation detector on the basis of a schematic sectional view, FIG. 2 provides, in FIGS. 2a and 2b, a qualitative representation of the spectral form of the predefined sensitivity distribution of the human eye and of the detector sensitivity for two variants of the first exemplary embodiment.

Illustrated in FIG. 1 is a first exemplary embodiment of an inventive radiation detector on the basis of a schematic sectional view.

A semiconductor body 1 is disposed on a carrier 2. Disposed in the semiconductor body on the side nearer the carrier 2 is an n-conducting layer 3, followed by functional layers 4a, 4b, 4c and 4d of different band gaps and/or thicknesses, which substantially form the active region 5 of the semiconductor body and serve to generate the detector signal. Preferably any two functional layers have different band gaps and thicknesses. Disposed after the functional layers is a p-conducting layer 6, followed by a filter layer structure comprising a filter layer 7. The semiconductor body, comprising the filter layer, the n- and p-conducting layers and the functional layers, is preferably implemented as monolithically integrated. Particularly preferably, the carrier is constituted by the growth substrate of the semiconductor body. The semiconductor body is preferably produced by epitaxy (e.g. MOVPE) on a suitable growth substrate.

The carrier 2 can, however, also be different from the growth substrate of the semiconductor body. For example, the carrier can be constituted by a layer on which the semiconductor body is disposed by its side opposite from the growth substrate after being produced thereon. The growth substrate is preferably removed after the semiconductor body has been disposed on the carrier layer. A mirror layer is preferably disposed between the carrier layer and the semiconductor body. This mirror layer can contain or be composed of a metal, for example Ag, Au, Al, Pt or an alloy containing at least one of these materials. The efficiency of the radiation detector can advantageously be increased in this way. Semiconductor chips of this kind, from which the growth substrate is removed during production, are also known as thin-film chips. The relative arrangement of the n-conducting and p-conducting layers with respect to the functional layers and the filter layer is then implemented according to the arrangement of the semiconductor body on such a carrier layer, optionally in a different order from that illustrated in FIG. 1. The filter layer is applied, optionally after being disposed on the carrier, to the structure comprising the functional layers and the n- and p-conducting layer.

The n- or p-conducting layer is preferably highly doped such that an expanded space charge region forms that extends from the p-conducting to the n-conducting layer. The functional layers are preferably disposed inside this space charge region. Such a space charge region can for example have a vertical extent of 1100 nm, preferably 1200 nm or more, depending on the dopant concentration.

Depending on their exact configuration—particularly in terms of thickness and band gap—the functional layers can absorb certain wavelengths from a radiation 8 incident on the semiconductor body. This absorption produces electron-hole pairs that contribute to the photocurrent, provided that they are generated in the space charge region. The intensity of the photocurrent as a function of wavelength in this case determines the sensitivity of a detector comprising such a semiconductor body or semiconductor chip (the semiconductor body on the carrier) as its radiation detecting element.

The filter layer structure is disposed after the active region 5 expediently on the side nearer the radiation input side 11 of the semiconductor body, which is the side through which most of the radiation to be detected enters the semiconductor body. The filter layer structure can in particular be disposed between active region 5 and radiation input side 11.

Via filter layer 7 and the arrangement and implementation of functional layers 4a, 4b, 4c and 4d, the sensitivity of the semiconductor body can be matched to a predefined spectral sensitivity distribution having a maximum at a wavelength $\lambda_0$.

Filter layer 7 preferably brings about this matching of detector sensitivity to the predefined sensitivity by absorbing wavelengths of the incident radiation that are smaller than the wavelength $\lambda_0$. Radiation with wavelengths in this range therefore strikes the active region with diminished intensity, and the signal generated in this wavelength range is matched to the predefined sensitivity distribution by absorption.

The electron-hole pairs generated in the filter layer by the absorption of radiation preferably do not substantially contribute to the photocurrent. To this end, the filter layer is disposed outside the space charge region. Disposing the filter layer outside the space charge region in this way simplifies the matching of detector sensitivity to the predefined sensitivity distribution, since the filter layer is decoupled from the functional layers, thereby reducing the risk that electron-hole pairs generated in the filter layer will have a disruptive influence on the photocurrent generated according to the predefined sensitivity distribution in the region of the functional layers. The photocurrent, which is decisive for the detector sensitivity, is preferably generated substantially in the active region.

Filter layer 7 determines the shape of the short-wave side of the detector sensitivity preferably by absorption across an indirect band gap. The filter layer is usefully fashioned suitably thick for this purpose.

A direct band gap of the filter layer preferably determines the short-wave limit of the detector sensitivity. For wavelengths smaller than the short-wave limit, the detector sensitivity vanishes or is negligible.

The photocurrent generated in the functional layers preferably determines at least the long-wave side of the detector sensitivity according to the predefined sensitivity distribution for wavelengths greater than $\lambda_0$. Particularly preferably, the band gaps of the functional layers at least partially correspond to wavelengths greater than $\lambda_0$. This simplifies the matching of the detector sensitivity to the predefined sensitivity on the short-wave side, since the latter is then determined substantially only by the filter layer, thereby reducing the expenditure of adjusting the functional layers and the filter layer with respect to each other.

The functional layers are preferably implemented such that their band gaps decisive for absorption increase with increasing distance from the carrier. Thus, functional layer 4a, which is farthest from the plane of incidence of the incident radiation 8 on the semiconductor body, is preferably the functional layer with the smallest band gap, and functional layer 4d, which faces the incident radiation 8, is the functional layer with the largest band gap.

The band gaps of the functional layers can be used to adjust the wavelength or wavelength range that is to be absorbed by a particular functional layer, and the thickness of the functional layer determines the fraction of radiant power absorbed and thus the photocurrent generated in that functional layer. The semiconductor body is preferably oriented such that the incident radiation 8 impinges on the semiconductor body primarily on the side nearer the filter layer 7 serving as a window layer for the signal-generating region of the semiconductor body.

A radiation detector provided with a semiconductor body of this kind makes it possible to shape the characteristic of the radiation detector by arranging and implementing the filter layer and the functional layers according to the predefined sensitivity distribution. For the functional layers this preferably applies to the long-wave side of the detector sensitivity, whereas filter layer 7 preferably determines the short-wave side of the detector sensitivity according to the predefined spectral sensitivity distribution.

Such a detector can be fabricated in a very space-saving and simple manner. There is no need for additional external filters to obtain a match with the predefined sensitivity.

The number of functional layers is preferably governed by the spectral width of the predefined sensitivity distribution. The broader the distribution, the higher the number of functional layers. It has been found that an arrangement of four different functional layers in a heterostructure is often well suited for matching the generated photocurrent with a predefined spectral sensitivity distribution, particularly that of the human eye.

The semiconductor body 1 illustrated in FIG. 1 can be provided with electrical interconnects—for example, metallizations disposed on the semiconductor body—to permit further processing of the signal generated in the semiconductor body. Such interconnects can be disposed on different sides of the carrier or on the side of the carrier provided with the semiconductor body. If the interconnects are disposed on different sides of the carrier, then the carrier is preferably suitably doped to increase its conductivity.

Furthermore, the semiconductor body can be disposed in a housing of the radiation detector that protects the semiconductor body against harmful external influences. The semiconductor body can also be surrounded by an envelope or said envelope can be formed around it, said envelope being disposed, for example, in a recess of the housing body. Such an envelope preferably contains a reaction resin, for example an acrylic, epoxy or silicon resin or a silicone. A wall of the recess in the housing body can be provided with a reflecting-enhancing, for example substantially metallic, material, thereby advantageously increasing the radiant power incident on the semiconductor body. The radiation detector is fashioned particularly preferably as a surface-mountable device (SMD).

In a preferred implementation of the radiation detector, it is implemented to detect radiation according to the sensitivity of the human eye, which has a sensitivity maximum at about o=555 nm (bright-adapted, day vision) or at about $\lambda_0$=500 nm (dark-adapted, night vision).

For a radiation detector matching the sensitivity of the eye, particularly the bright-adapted human eye, the semiconductor body 1 is preferably based on the III/V semiconductor material systems $In_xGa_yAl_{1-x-y}P$ or $In_xGa_yAl_{1-x-y}As$. The functional layers 4a, 4b, 4c and 4d are preferably formed of these material systems. The band gaps can be adjusted in this case by varying the Al content, with a higher Al content corresponding to a larger band gap. This applies at least to Al contents at which the aforesaid semiconductor material systems form direct semiconductors, which are preferred for the functional layers. Particularly preferably, the semiconductor body is based on $In_{0.5}(Ga_{1-x}Al_x)_{0.5}P$ or $In_xGa_yAl_{1-x-y}As$, thereby simplifying the production of functional layers with a selected band gap, for example by varying the Al content.

In a radiation detector matching the sensitivity of the eye, filter layer 7 is preferably formed of $Al_xGa_{1-x}As$ ($0 \leq x \leq 1$) or GaP. Semiconductor bodies comprising said function or filter layer materials can advantageously be produced in monolithically integrated form. For example, the carrier is constituted by the growth substrate, which for the above-cited material systems can for example contain or be composed of GaAs.

The materials cited for the filter layer can have a direct and an indirect band gap, in which case the direct band gap preferably corresponds to a wavelength smaller than $\lambda_0$, which particularly preferably defines the short-wave limit of detector sensitivity.

GaP, for example, has a direct band gap ($E_G \sim 2.73$ eV) that corresponds to a wavelength of around 455 nm, whereas the direct band gap ($E_G \sim 2.53$ eV) of $Al_{0.8}Ga_{0.2}As$ corresponds to around 490 nm. The absorption of incident radiation across the indirect band gap preferably determines the short-wave side of the detector sensitivity for wavelengths smaller than $\lambda_0$. The fraction of the radiant power absorbed across the indirect band gap can be influenced via the thickness of the filter layer.

In a further preferred implementation of the radiation detector or the semiconductor body, its sensitivity exhibits a maximum at a wavelength $\lambda_D$ that preferably differs from the wavelength $\lambda_0$ of the maximum of the predefined spectral sensitivity distribution by 20 nm, particularly preferably 10 nm or less.

The predefined spectral sensitivity distribution, particularly that of the human eye, is frequently stated such that it assumes a value of 1 or 100% at the wavelength $\lambda_0$. The sensitivity of the detector, which depends on the signal strength, is often stated in amperes per watt of incident radiant power.

Thus, to effect a comparison with the detector sensitivity having the predefined spectral sensitivity distribution, it is useful to match the two sensitivities to each other such that the predefined sensitivity distribution assumes a value of 100% at $\lambda_0$ and the detector sensitivity assumes a value of 100% at $\lambda_D$ (relative sensitivities). The present description pertains to relative sensitivities unless otherwise stated.

Figure 2A:
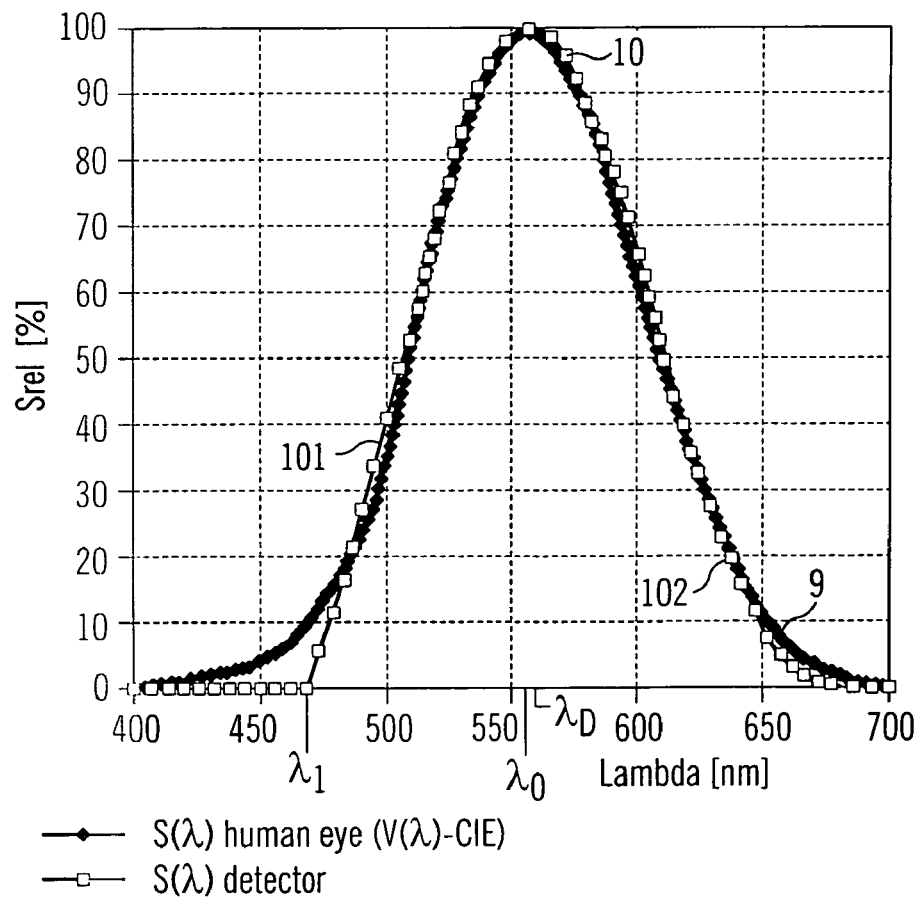
Figure 2B:
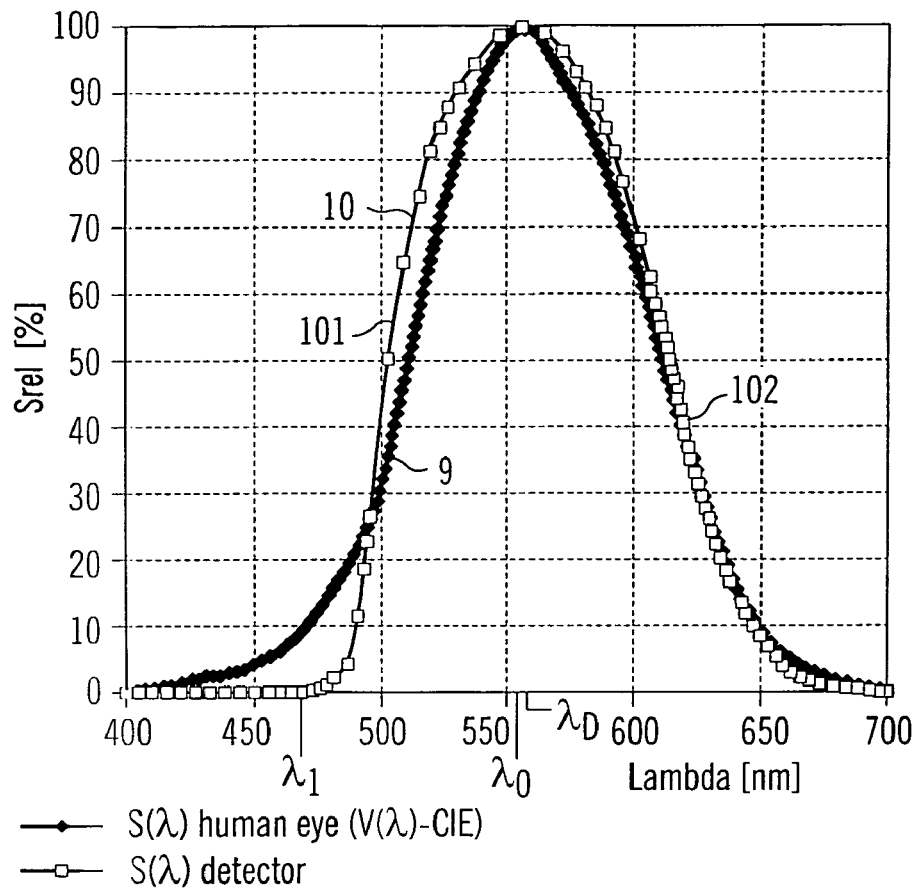

FIG. 2 is a qualitative representation of the curve of the predefined sensitivity of the eye and the relative sensitivity of the detector (Srel) for two variants (FIGS. 2a and 2b, respectively) of the first exemplary embodiment of an inventive radiation detector, as a function of the wavelength of the incident radiation. The sensitivity of the eye is represented in FIG. 2 by the V(λ) curve defined by the CIE (Commission Internationale l'Eclairage).

The dependencies illustrated in FIGS. 2a and 2b were obtained from simulation calculations based on data corresponding to the below-stated compositions for the semiconductor body.

In the first variant, corresponding to FIG. 2a, the radiation detector comprises a semiconductor body according to FIG. 1, produced monolithically integrated and based on $In_x$-$Ga_yAl_{1-x-y}P$. The semiconductor body is grown epitaxially, for example by an MOVPE process, on a growth substrate 2 made of GaAs. Initially, a roughly 100 nm thick, highly doped ($n^+$) n-conducting layer 3 of $In_{0.5}Al_{0.5}P$ is grown on the GaAs-containing substrate 2. This is followed by the production of the active region 5, which includes substantially undoped functional layers 4a ($In_{0.5}Ga_{0.5}P$, thickness~50 nm, $E_G$~1.91 eV, $\lambda_G$~50 nm), 4b ($In_{0.5}(Ga_{0.9}Al_{0.1})_{0.5}P$, thickness~100 nm, $E_G$~1.97 eV, $\lambda_G$~630 nm), 4c ($In_{0.5}(Ga_{0.7}Al_{0.3})_{0.5}P$, thickness~400 nm, $E_G$~2.07 eV, $\lambda_G$~600 nm), and 4d ($In_{0.5}(Ga_{0.5}Al_{0.5})_{0.5}P$, thickness~500 nm, $E_G$~2.20 eV, $\lambda_G$~565 nm). $E_G$ here denotes the decisive band gap of the material concerned and $\lambda_G$ the wavelength corresponding to that band gap. An approximately 100 nm thick, highly doped ($p^+$) p-conducting $In_{0.5}Al_{0.5}P$ layer 6 is then produced, followed by a filter layer 7. The space charge region created by n-conducting layer 3 and p-conducting layer 6 extends through the functional layers. Filter layer 7 is disposed outside the space charge region.

It should be noted that the Al content of the functional layers can deviate from the content cited here. For example, a radiation detector matching the sensitivity of the eye can also be created with functional layers whose Al content differs from the above-cited Al content by 10% or less, preferably by 5% or less.

In the first variant, illustrated in FIG. 2a, the filter layer is composed of GaP and is about 15 μm thick, and the detector sensitivity 10 is shown relative to the sensitivity 9 of the eye.

The maximum in the sensitivity of the eye and that of the detector nearly coincide in this case, $\lambda_D$ being slightly greater than $\lambda_0$. The difference between these wavelengths is preferably 10 nm, particularly preferably 5 nm or less. The short-wave side 101 of the detector sensitivity 10 is determined in this case by filter layer 7. Below a boundary wavelength $\lambda_1$ (~455-465 nm), the detector sensitivity is nearly zero. This boundary wavelength roughly corresponds to the direct band gap ($E_G$~2.73 eV) of GaP. For wavelengths greater than $\lambda_1$, filter layer 7 determines the shape of the short-wave side of the detector sensitivity by absorption across its indirect band gap. Since GaP has a relatively shallow absorption edge, the filter layer is implemented as relatively thick, at 15 μm, in order to match the detector sensitivity to the predefined spectral sensitivity distribution in the wavelength range below $\lambda_0$.

The long-wave side 102 of the detector sensitivity is determined by the implementation of the functional layers. For the wavelength range from about 550 to about 620 nm, in which the detector sensitivity and the predefined sensitivity exhibit high values, the corresponding functional layers 4d and 4c as described above are implemented as relatively thick, at 500 nm and 400 nm, respectively, and a correspondingly high photocurrent signal is therefore generated in the radiation detector within this wavelength range. Conversely, layer 4b is implemented as relatively thin, at 100 nm, since for wavelengths in the range above approximately 620 nm the sensitivity of the eye is comparatively low. In the range above approximately 640 to 680 nm, particularly up to 700 nm, and in the μm range, the sensitivity of the eye is very low and the corresponding functional layer 4a is therefore implemented as relatively thin, at 50 nm.

The radiation detector is preferably implemented such that at an arbitrary predefined wavelength, the deviation of the relative values of the detector sensitivity from the predefined sensitivity distribution is preferably less than 20%, particularly preferably less than 15%. For sensitivity values in excess of about 60%, the difference between the two sensitivities at an arbitrary given wavelength is preferably less than 10%, particularly preferably less than 5%.

With a filter layer 15 μm thick, however, such a semiconductor body 1 for a radiation detector is comparatively thick.

In the second variant, illustrated in FIG. 2b, the filter layer 7 is composed substantially of $Al_{0.80}Ga_{0.20}As$ and is implemented as about 1.5 μm thick.

The long-wave side 102 of detector sensitivity 10 is determined by the functional layers, as it is in FIG. 2a. The implementation of the functional layers is different from that of FIG. 2a, however, due to the altered composition of the filter layer. The simulation calculation for FIG. 2b was based on the following implementation of the filter layers: functional layer 4a ($In_{0.5}Ga_{0.5}P$, thickness~50 nm, $E_G$~1.91 eV, $\lambda_G$~650 nm), functional layer 4b ($In_{0.5}(Ga_{0.9}Al_{0.1})_{0.5}P$, thickness~100 nm, $E_G$~1.97 eV, $\lambda_G$~630 nm), functional layer 4c ($In_{0.5}(Ga_{0.7}Al_{0.3})_{0.5}P$, thickness~300 nm, $E_G$~2.07 eV, $\lambda_G$~600 nm), and functional layer 4d ($In_{0.5}(Ga_{0.5}Al_{0.5})_{0.5}P$, thickness~700 nm, $E_G$~2.20 eV, $\lambda_G$~565 nm). Differences from the implementation of FIG. 2a can be seen in the thickness of functional layers 4c and 4d, which due to the altered composition of the filter layer are implemented as thinner and thicker, respectively, than they were in the embodiments of FIG. 2a. The basic shape of the long-wave side 102 of the detector sensitivity 10 illustrated in FIG. 2b is substantially in agreement with the detector sensitivity illustrated in FIG. 2a.

However, the short-wave side 102 determined by filter layer 7 as illustrated in FIG. 2b differs from the shape illustrated in FIG. 2a and the sensitivity 9 of the eye. Since in the variant of FIG. 2b the short-wave side is determined by an AlGaAs-containing filter layer and $Al_{0.80}Ga_{0.20}As$ has a steeper absorption edge than GaP, the slope of the detector sensitivity 10 in the short-wave region 101 is steeper than the slope illustrated in FIG. 2a.

The maximum detector sensitivity $\lambda_D$ occurs at about 560 to 565 nm and is therefore slightly to the right of that of the predefined spectral sensitivity distribution of the human eye, which occurs at about 555 nm ($\lambda_0$). The short-wave boundary wavelength $\lambda_1$ is located at about 475 nm to 490 nm, which roughly corresponds to the direct band gap ($E_G$~2.53 eV) of $Al_{0.80}Ga_{0.20}As$.

Figure 3:
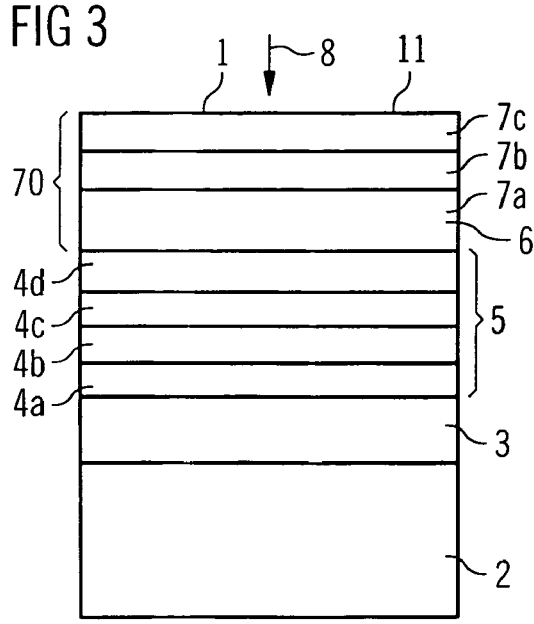
FIG. 3 shows a second exemplary embodiment of an inventive radiation detector on the basis of a schematic sectional view, FIG. 4 provides, in FIGS. 4a and 4b, a qualitative representation of the spectral form of the predefined sensitivity distribution of the human eye and of the detector sensitivity for two variants of the second exemplary embodiment.

A second exemplary embodiment of an inventive radiation detector is depicted in sectional view in FIG. 3.

The second exemplary embodiment of FIG. 3 is substantially the same as the first exemplary embodiment illustrated in FIG. 1. It differs in that a filter layer structure 70 comprising a plurality of filter layers 7a, 7b and 7c is monolithically integrated into semiconductor body 1. The filter layers preferably have different band gaps and/or thicknesses. In particular, the p-conducting layer 6 can also be implemented to perform filtering, although this is not absolutely necessary. Preferably at least one filter layer of the filter layer structure, particularly preferably all of said layers, are highly doped, for instance p-conducting ($p^+$).

Absorption in the filter layers of the filter layer structure takes place substantially across a direct band gap of the respective filter layer. In contrast to the exemplary embodiment according to FIG. 1, in which the filtering and particularly the matching of detector sensitivity on the short-wave side occurs primarily by absorption across the indirect band gap, the filter layer structure illustrated in FIG. 3 can be implemented as relatively thin. In particular, the overall thickness of the filter layer structure 70 can be 1 µm, preferably 0.9 µm or 0.8 µm, or less. In addition, semiconductor body 1 is preferably implemented as monolithically integrated.

Reducing the thickness of the filter layer structure advantageously lowers the production cost of such a semiconductor body, for example as a result of reduced epitaxy times.

In particular, by means of a filter layer structure 70 comprising a plurality of filter layers a relatively rapid drop in detector sensitivity in the area of the band gap of a filter layer may be prevented, for example in the area around $\lambda_1$ in FIG. 2a or 2b. The detector sensitivity can therefore also be matched more closely to the predefined spectral sensitivity distribution in the region of a direct band gap of a filter layer or in the region of a short-wave tail of the predefined distribution.

FIG. 4 qualitatively represents the spectral shape of the predefined sensitivity distribution of the human eye and the detector sensitivity for two variants of the second exemplary embodiment (FIGS. 4a and 4b).

In FIG. 4, for each of the two variants, the responsivity of the radiation detector in amperes of generated photocurrent per watt of incident radiant power is plotted against the wavelength of the radiation 8 incident on the radiation detector. The sensitivity distribution of the human eye is illustrated in relation to responsivity. The dependences shown in FIG. 4 were obtained by suitable simulation calculations, as in FIG. 2.

The long-wave side 102 of the detector sensitivity 10 according to FIGS. 4a and 4b is determined by functional layers 4a, 4b, 4c and 4d in active region 5. In FIG. 4a, the functional layers are implemented as described in regard to FIG. 2a, and in FIG. 4b as described in regard to FIG. 2b.

Long-wave side 102 follows substantially the same path as the long-wave side of the predefined spectral sensitivity distribution 9 of the human eye. The shapes of the long-wave sides in FIG. 4 are substantially the same as those illustrated in FIG. 2.

However, differences are apparent on the short-wave side 101 of the detector sensitivity. Compared to detector sensitivity 10 in FIG. 2a or 2b, the matching is advantageously improved owing to the plurality of filter layers of different band gaps and/or thickness in the filter layer structure.

It has been found particularly advantageous for the predefined spectral sensitivity distribution of the human eye to have the filter layers be three in number (7a, 7b and 7c).

Detector sensitivity 10 according to FIG. 4a results for example from a filter layer structure comprising a filter layer 7a ($In_{0.5}Al_{0.5}P$, thickness~400 nm) 7b ($In_{0.5}(Ga_{0.5}Al_{0.7})_{0.5}P$, thickness~250 nm) and 7c (GaP, thickness~100 nm). If the p-conducting layer 6, as illustrated in FIG. 3, is implemented as filter layer 7a, the n-conducting layer 3 ($In_{0.5}Al_{0.5}P$, thickness 400 nm) is preferably given the same composition and thickness as p-conducting layer 6. The thickness of the filter layer structure is therefore approximately 750 nm.

At the wavelength $\lambda_0$~555 nm of the maximum sensitivity of the bright-adapted eye, the responsivity of the radiation detector is preferably about 0.37 A/W. Due to the plurality of filter layers 7a, 7b and 7c, the detector sensitivity also matches the predefined spectral sensitivity distribution at wavelengths below about 460 nm. The GaP-containing filter layer 7c is implemented as very thin compared to filter layer 7 of FIG. 2a, and serves basically as a contact layer for a metal-containing interconnect (not shown) disposed on it, since GaP is distinguished by advantageous contact properties both to metallic interconnects and to materials of the III/V semiconductor material system $In_xGa_yAl_{1-x-y}P$.

The p-conducting layer 6, as filter layer 7a provided to perform filtering, is implemented, at 400 nm, as relatively thick in comparison to the variants of FIGS. 2a and 2b.

A filter layer structure 70 for a radiation detector with a sensitivity 10 according to FIG. 4b comprises for example a filter layer 7a ($In_{0.5}Al_{0.5}P$, thickness~400 nm) 7b ($Al_{0.7}Ga_{0.3}As$, thickness~250 nm) and 7c ($Al_{0.8}Ga_{0.2}As$, thickness~200 nm). The maximum responsivity of this radiation detector, occurring at about 0.34 A/W, is slightly below that of the detector according to FIG. 4a. The overall thickness of the filter layer structure is roughly 850 nm.

In FIG. 4b, the short-wave side 101 also closely matches the predefined spectral sensitivity distribution 9 in the region of relatively short wavelengths, for example below 490 nm.

In sum, the matching of detector sensitivity to the predefined spectral sensitivity distribution can be improved by providing a plurality of filter layers and absorption substantially across the direct band gap of the filter layers. An advantageously small thickness is simultaneously obtained for the filter layer structure.

Figure 5:
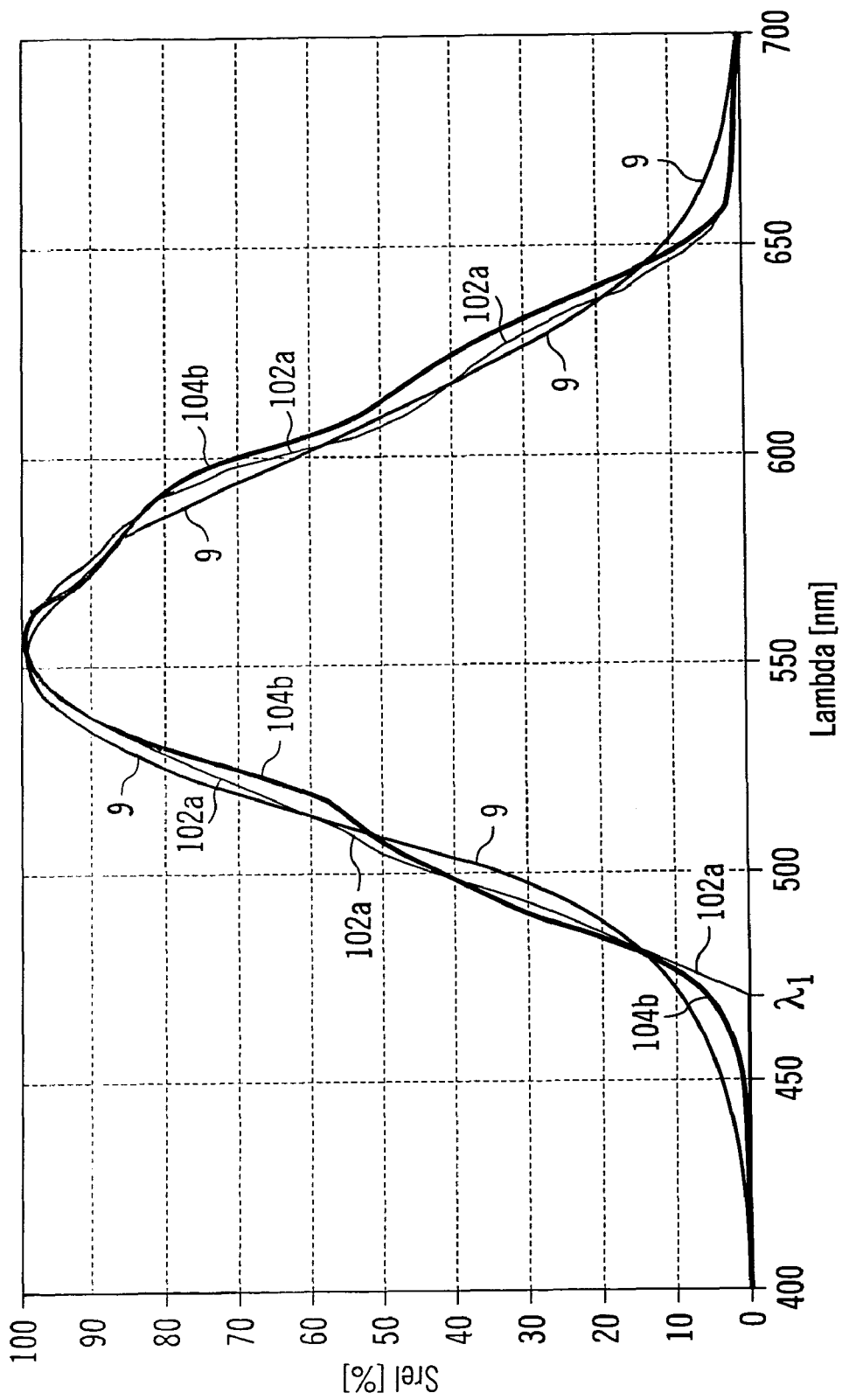
FIG. 5 is a quantitative representation of a comparison of the predefined sensitivity distribution of the human eye and the detector sensitivities for a detector according to the first exemplary embodiment and a detector according to the second exemplary embodiment.

Comparing the exemplary embodiments according to FIG. 1 and FIG. 3, the sensitivity 102a of a radiation detector as in FIG. 2a, the sensitivity 104b of a radiation detector as in FIG. 4b, and the predefined spectral sensitivity 9 of the human eye are represented quantitatively in relation to one another in FIG. 5. The detector sensitivities are based on sensitivity measurements performed on radiation detectors provided with correspondingly fabricated semiconductor bodies.

On curve 102a, due to the relatively thick, GaP-based filter layer, there is a short-wave limit $\lambda_1$ beyond which the detector sensitivity is substantially negligible. On curve 104b, by contrast, due to the filter layer structure comprising a plurality of filter layers, a good match of detector sensitivity to the sensitivity of the eye is obtained even in the range of wavelengths below $\lambda_1$.

The radiation detector can be implemented according to the invention particularly such that at an arbitrary predefined wavelength, the relative detector sensitivity and the predefined spectral sensitivity distribution differ from each other by 20%, preferably 10%, particularly preferably 5% or less.

It should be noted that the invention is not limited to radiation detectors based on the sensitivity of the eye. Other detector sensitivities, for example based on a predefined rectangular spectral distribution, can also be devised by suitably configuring the functional layers and the filter layer. Furthermore, the number of functional layers—four in the exemplary embodiment—should not be considered limitative. A different number of functional layers may also be provided in an inventive radiation detector.

It should also be noted that according to the invention, the functional layers of the active region do not necessarily have to be produced one after the other with a fixed composition characteristic of the functional layer concerned, for instance in the above-recited compositions for functional layers 4a, 4b, 4c and 4d with their respective Al contents.

Rather, the functional layers can also be created in a functional region by purposefully varying a production parameter during the production of the functional region. By means of the production parameter the band gap can preferably be varied in the functional region, particularly preferably during epitaxy and in the direction of growth. The production parameter can be varied in sections or continuously overall, preferably linearly. The production parameter is preferably varied from a predefined initial value to a predefined final value. Said initial value and final value depend on the predefined spectral sensitivity distribution.

For wavelength ranges in which a relatively high signal strength is desired, the production parameter can be varied during epitaxy relatively slowly compared to the rate of growth in the vertical direction, so that the functional region is provided with a "functional layer" of comparatively large "thickness," over the vertical extent of which the production parameter changes relatively slowly or is substantially constant.

For example, the Al content corresponding to functional layers 4a, 4b, 4c and 4d of a radiation detector as illustrated in FIG. 1, with a detector sensitivity curve as illustrated in FIG. 2a or 2b for the predefined spectral sensitivity distribution of the human eye, can be varied continuously from 0 (initial value) through 0.1 and 0.3 to 0.5 (final value) during the production of a functional region, in which case, for a thickly implemented functional layer, the Al content is varied more slowly relative to the growth rate of the functional layer than it is in the case of a more thinly implemented functional layer.

The production parameter is preferably varied relatively rapidly within the range of values between the desired values for the production parameter as applied to the functional layers—for example between an Al content of 0.1 and 0.3.

Such a functional region created by varying a production parameter can be implemented as a graded index separate confinement heterostructure ("grinsch structure" for short). The term "graded index" pertains to a, for example gradual, variation of the production parameter, often accompanied by a change in refractive index. Any barrier layers for charge carriers in the functional region can be created outside the functional region (separate confinement), and the functional region as a whole can be implemented as a heterostructure.

A functional region created by varying a production parameter is advantageously relatively tolerant of any fluctuations or slight deviations of the desired values of the production parameter for the functional layers that may occur during the production of the functional region. In the case of functional layers that are produced separately one after the other with separately adjusted, constant respective production parameters, there is a risk that slight deviations of the value of the production parameter will cause the spectral sensitivity distribution of the detector to deviate relatively sharply from the predefined spectral sensitivity distribution. This risk can be reduced by varying a production parameter from an initial to a final value during the production of the functional region. The sole necessity is that the initial and final values defined by means of the spectral sensitivity distribution be attained with relative exactitude during the production of the functional region, whereas in the region between these values the tolerance of deviations in the desired values for the functional layer is advantageously increased.

The scope of protection of the invention is not limited to the examples given hereinabove. The invention is embodied in each novel characteristic and each combination of characteristics, which particularly includes every combination of any features, which are stated in the claims, even if this feature or this combination of features is not explicitly stated in the claims or in the examples.

The invention claimed is:

1. A radiation detector that detects radiation according to a predefined spectral sensitivity distribution that exhibits a maximum at a predefined wavelength $\lambda_0$, the radiation detector comprising a semiconductor body with an active region serving to generate a detector signal and intended to receive radiation, wherein said active region comprises a plurality of functional layers, at least two of said functional layers having different band gaps, each one of the functional layers being implemented to absorb at least some of the radiation;

wherein at least a part of said functional layers absorbs radiation in a wavelength range that includes wavelengths greater than the wavelength $\lambda_0$; and wherein the semiconductor body corresponds to a PIN diode structure.

2. The radiation detector as in claim 1, wherein said predefined spectral sensitivity distribution is that of the human eye.

3. The radiation detector as in claim 1, wherein said semiconductor body contains at least one III/V semiconductor material.

4. The radiation detector as in claim 1, wherein disposed after said active region is a filter layer structure comprising at least one filter layer, which filter layer structure determines the short-wave side of the detector sensitivity in accordance with the predefined spectral sensitivity distribution by absorbing radiation in a wavelength range that includes wavelengths smaller than $\lambda_0$.

5. A radiation detector that detects radiation in accordance with the predefined spectral sensitivity distribution of the human eye, which exhibits a maximum at the wavelength $\lambda_0'$, the radiation detector comprising a semiconductor body with an active region serving to generate a detector signal and intended to receive radiation, wherein said semiconductor body comprises at least one III/V semiconductor material and said active region comprises a plurality of functional layers;

wherein each one of said functional layers is configured to absorb at least some of the radiation; and wherein the semiconductor body corresponds to a PIN diode structure.

6. The radiation detector as in claim 5, wherein said functional layers at least partially absorb radiation in a wavelength range that includes wavelengths greater than the wavelength $\lambda_0'$.

7. The radiation detector as in claim 5, wherein said functional layers have different band gaps and/or thicknesses.

8. The radiation detector as in claim 5, wherein disposed after said active region is a filter layer structure comprising at least one filter layer, which filter layer structure determines the short-wave side of the detector sensitivity in accordance with said predefined spectral sensitivity distribution by absorbing radiation in a wavelength range that includes wavelengths smaller than $\lambda_0'$.

9. A radiation detector that detects radiation in accordance with a predefined spectral sensitivity distribution that exhibits a maximum at a predefined wavelength $\lambda_0$, said radiation detector comprising a semiconductor body with an active region serving to generate detector signals and intended to receive radiation, wherein said active region comprises a plurality of functional layers, at least two of said functional layers having different band gaps and each of the functional layers is implemented to absorb at least some of the radiation;

wherein disposed after said active region is a filter layer structure comprising at least one filter layer, which filter layer structure forms a portion of the semiconductor body and determines the short-wave side of said detector sensitivity in accordance with said predefined spectral sensitivity distribution by absorbing radiation in a wavelength range that includes wavelengths smaller than $\lambda_0$; and wherein the semiconductor body corresponds to a PIN diode structure.

10. The radiation detector as in claim 9, wherein said predefined spectral sensitivity distribution is that of the human eye.

11. The radiation detector as in claim 9, wherein said semiconductor body contains at least one III/V semiconductor material.

12. The radiation detector as in claim 9, wherein said functional layers at least partially absorb radiation in a wavelength range that includes wavelengths greater than the wavelength $\lambda_0$.

13. The radiation detector as in claim 9, wherein said functional layers have different thicknesses.

14. The radiation detector as in claim 9, wherein said filter layer structure is disposed after said active region in the direction of the incident radiation.

15. The radiation detector as in claim 9, wherein said filter layer structure comprises a single filter layer having a direct band gap and an indirect band gap.

16. The radiation detector as in claim 15, wherein said direct band gap is larger than the band gap of a functional layer disposed after said filter layer on the side nearer said active region.

17. The radiation detector as in claim 16, wherein said filter layer determines the short-wave side of said detector sensitivity by absorbing radiation via said indirect band gap in a wavelength range that includes wavelengths smaller than $\lambda_0$.

18. The radiation detector as in claim 15, wherein said direct band gap determines a short-wave limit of said detector sensitivity.

19. The radiation detector as in claim 15, wherein the thickness of said filter layer is greater than 1 µm, particularly 10 µm or more.

20. The radiation detector as in claim 4, wherein said filter layer structure comprises a plurality of filter layers of different band gaps and/or thickness.

21. The radiation detector as in claim 20, wherein said filter layer structure determines the short-wave side of said detector sensitivity by absorbing radiation via a direct band gap of the respective filter layer in a wavelength range that includes wavelengths smaller than $\lambda_0$.

22. The radiation detector as in claim 20, wherein said filter layer structure has a thickness of 1 µm or less.

23. The radiation detector as in claim 1, wherein said functional layers determine by their implementation the long-wave side of said detector sensitivity in accordance with said predefined spectral sensitivity distribution for wavelengths greater than $\lambda_0$.

24. The radiation detector as in claim 1, wherein the respective band gaps of functional layers disposed one after the other in said semiconductor body at least partially increase in the direction of the incident radiation.

25. The radiation detector as in claim 1, wherein said functional layers or at least a portion of said functional layers are substantially undoped.

26. The radiation detector as in claim 1, wherein said active region comprises at least one heterostructure.

27. The radiation detector as in claim 1, wherein said active region, particularly the functional layers, or said filter layer structure contains at least one III/V semiconductor material.

28. The radiation detector as in claim 1, wherein said semiconductor body particularly the semiconductor body comprising said filter layer structure, is monolithically integrated.

29. The radiation detector as in claim 27, wherein the at least one III/V semiconductor material comprises a material having a composition $In_xGa_yAl_{1-x-y}P$, $In_xGa_yAl_{1-x-y}As$, or $In_xGa_yAl_{1-x-y}N$, wherein in each case $0 \leq x \leq 1$, $0 \leq y \leq 1$ and $x+y \leq 1$.

30. The radiation detector as in claim 5, wherein the at least one III/V semiconductor material comprises a material having a composition $In_xGa_yAl_{1-x-y}P$, $In_xGa_yAl_{1-x-y}As$, or $In_xGa_yAl_{1-x-y}N$, wherein in each case $0 \leq x \leq 1$, $0 \leq y \leq 1$ and $x+y \leq 1$.

31. The radiation detector as in claim 1, wherein the active region corresponds to a continuous, intrinsic region of the semiconductor body.

32. The radiation detector as in claim 5, wherein the active region corresponds to a continuous, intrinsic region of the semiconductor body.

33. The radiation detector as in claim 9, wherein the active region corresponds to a continuous, intrinsic region of the semiconductor body.

34. The radiation detector as in claim 1, wherein the functional layers are epitaxial layers that form a monolithically integrated active region.

35. The radiation detector as in claim 5, wherein the functional layers are epitaxial layers that form a monolithically integrated active region.

36. The radiation detector as in claim 9, wherein the functional layers are epitaxial layers that form a monolithically integrated active region.

37. The radiation detector as in claim 1, wherein the functional layers are consecutive layers in a layer stack, and wherein each functional layer is in direct contact with adjacent functional layers in the layer stack.

38. The radiation detector as in claim 5, wherein the functional layers are consecutive layers in a layer stack, and wherein each functional layer is in direct contact with adjacent functional layers in the layer stack.

39. The radiation detector as in claim 9, wherein the functional layers are consecutive layers in a layer stack, and wherein each functional layer is in direct contact with adjacent functional layers in the layer stack.

* * * * *